US006449077B1

(12) United States Patent
Broutin et al.

(10) Patent No.: US 6,449,077 B1
(45) Date of Patent: Sep. 10, 2002

(54) METHOD AND APPARATUS FOR ELECTRICALLY SWITCHING A WAVELENGTH CONTROL SYSTEM

(75) Inventors: Scott L. Broutin, Kutztown; James Kevin Plourde, Allentown; John William Stayt, Jr., Schnecksville, all of PA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/265,338

(22) Filed: Mar. 9, 1999

(51) Int. Cl.[7] ............................................... H04B 10/04
(52) U.S. Cl. ........................................ 359/187; 372/32
(58) Field of Search ................................ 359/187, 161; 372/20, 32, 34, 99

(56) References Cited

U.S. PATENT DOCUMENTS

| 4,485,475 A | * 11/1984 | Large et al. ................. 359/187 |
| 4,901,306 A | 2/1990 | Gardner |
| 4,912,526 A | 3/1990 | Iwaoka et al. |
| 4,914,662 A | 4/1990 | Nakatani et al. |
| 5,084,884 A | 1/1992 | Terada |

(List continued on next page.)

OTHER PUBLICATIONS

Tidrow et al., "A high strain two–stack two–color quantum well infrared photodetector", Appl. Phys. Lett. 70(7):859–861, Feb. 1997.
Chen et al., "Two–color corrugated quantum–well infrared photodetector for remote temperature sensing", Appl. Phys. Lett. 72(1):7–9, Jan. 1998.
1998 Santec Component Series, pp. 1–11.
Wavelength–Selected (D2526G) Laser 2000 Direct Modulated Isolated DFB Laser Module, Lucent Technologies, Bell Labs Innovations, Aug. 1997, pp. 1–8.
Wavelength Locker Test Report, JDS Fitel, Dec. 4, 1997, pp 1–3.
Nortel Networks: Optical Networking/Transport, Nov. 11, 1998, pp 1–3.
Broadband: Product Portfolio—Utility Networks, Nortel, Nov. 18, 1998, pp 1–2.
News Letter, 32ch Tunable Laser Light Source System, Nov. 18, 1998, p. 1.
News Letter, Optical Variable Attenuator, OVA–630, Nov. 18, 1998, p. 1.
Components for DWDM Systems, Santec, Laser Focus World, Oct. 1998, p. 70.

Primary Examiner—Leslie Pascal
(74) Attorney, Agent, or Firm—Duane Morris LLP; Steven E Koffs

(57) ABSTRACT

An apparatus controls a light source, which may be a laser. A first detector provides a first electrical signal representing an amplitude of a first light that is output by the light source. A filter receives the first light and provides a filtered light having an amplitude that depends on the amplitude and wavelength of the first light. A second detector provides a second electrical signal representing the amplitude of the filtered light. A switching device, such as a multiplexer, is capable of providing either the first electrical signal or the second electrical signal as its output signal. A common amplifier is coupled to the switching device. The common amplifier amplifies the output signal of the switching device, to alternately provide a first amplified signal and a second amplified signal, representing the first and second electrical signals, respectively. A processor receives the first and second amplified signals and generates a control signal that depends on the wavelength of the first light and is independent of the amplitude of the first light. The control signal may be, for example, a control signal for a thermoelectric cooler or a bias signal for a laser. The control signal is used to control the light source.

34 Claims, 2 Drawing Sheets

U.S. PATENT DOCUMENTS

| | | | |
|---|---|---|---|
| 5,299,045 A | * 3/1994 | Sekiguchi | 359/130 |
| 5,299,212 A | * 3/1994 | Koch et al. | 372/32 |
| 5,384,799 A | 1/1995 | Osterwalder | |
| 5,428,700 A | 6/1995 | Hall | |
| 5,509,023 A | * 4/1996 | Glance et al. | 372/20 |
| 5,691,989 A | * 11/1997 | Rakuljic et al. | 372/20 |
| 5,700,090 A | * 12/1997 | Eryurek | 374/210 |
| 5,764,678 A | 6/1998 | Tada | |
| 5,786,915 A | 7/1998 | Scobey | |
| 5,832,014 A | 11/1998 | Johnson | |
| 5,900,959 A | * 5/1999 | Noda et al. | 359/180 |
| 6,067,181 A | * 5/2000 | Mizrahi | 359/187 |
| 6,088,142 A | * 7/2000 | Cao et al. | 359/132 |

\* cited by examiner

METHOD AND APPARATUS FOR ELECTRICALLY SWITCHING A WAVELENGTH CONTROL SYSTEM

FIELD OF THE INVENTION

The present invention relates to the field of wavelength control systems for electromagnetic radiation.

DESCRIPTION OF THE RELATED ART

Wavelength or frequency stabilization of lasers is increasingly important for dense wavelength division multiplexed (DWDM) fiber optic systems as the spacing between channels is reduced to obtain additional system capacity. In this regard, these systems are analogous to microwave radio systems with multiplexed carriers in which the frequency stabilization of carriers has traditionally been an important issue. In a wavelength stabilized laser system, wavelength or frequency drift may be introduced by the aging or temperature dependence of the laser itself, or by the aging or temperature dependence of the optical reference filter, the optical detectors, or the stabilization electronics.

U.S. Pat. No. 5,832,014 to Johnson, which is assigned to Lucent Technologies Inc., is incorporated herein by reference in its entirety for its teachings on wavelength stabilization in tunable semiconductor lasers. Johnson describes a tunable semiconductor laser including a gain section and at least one tuning section. Spontaneous emission (SE) from the tuning section is detected and used in a feedback control loop to control the amount of current applied to the tuning section. The feedback control loop operates to maintain the detected SE at a constant level, such that the current applied to the tuning section is adjusted to compensate for the effects of aging and the laser output wavelength is thereby stabilized.

Johnson rejects a number of alternative approaches, stating that, "Conventional approaches to solving the wavelength stabilization problem in tunable semiconductor lasers generally involve monitoring the lasing wavelength using precise filters . . . . However, these filtering techniques can be expensive and difficult to implement in many practical applications. Moreover, the required filters are often unsuitable for integration with the semiconductor laser on a single chip."

A method and apparatus are desired that makes use of filters for wavelength stabilization in semiconductor lasers practical and effective.

SUMMARY OF THE INVENTION

The present invention is a method and system for conditioning signals from two optical detectors, including: multiplexing electrical signals from the two detectors into a single electrical path that is connected to the processor; and conditioning the signals in the single electrical path.

The invention is an improvement in a system for controlling a light source. The system has first and second optical detectors providing first and second electrical signals, respectively. The first and second electrical signals are multiplexed into a single electrical path that is connected to the processor. The signals are conditioned in the single electrical path to form conditioned signals that are used by a processor to control the light source.

DETAILED DESCRIPTION

Figure 1:
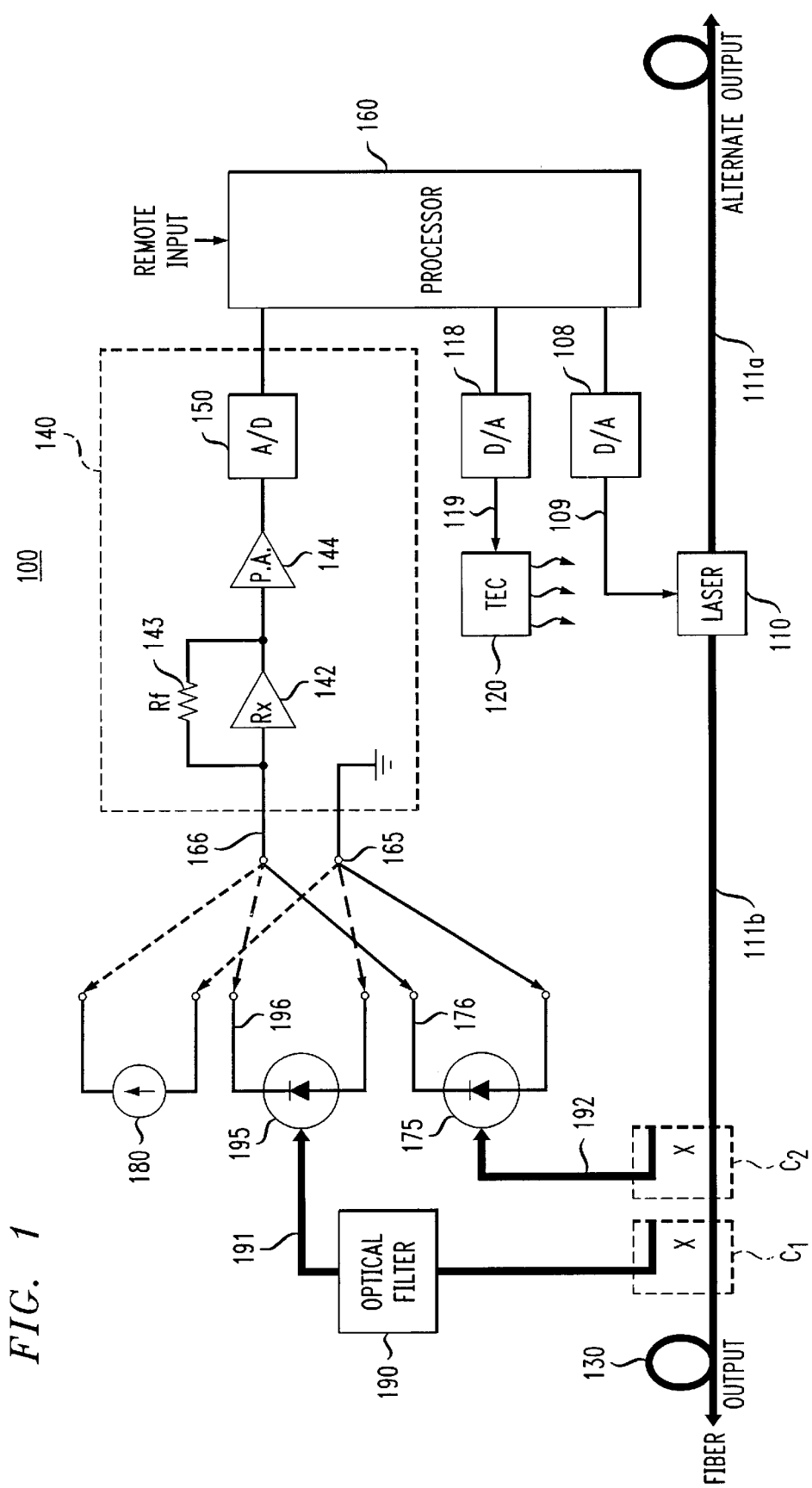
FIG. 1 is a block diagram of a first exemplary embodiment of the invention.

FIG. 1 shows a first exemplary embodiment of the invention.

The wavelength stabilized laser system 100 includes a laser 110 that transmits a laser light 111$b$ from the front and may also transmit a laser light 111$a$ from the backface of laser 110. The laser light 111$b$ is transmitted through an optical fiber 130.

To monitor the wavelength of laser light 111$b$, two optical couplers $C_1$ and $C_2$ are provided. Optical coupler $C_1$ transmits a portion of the light 111$b$ to a filter 190. Optical coupler $C_2$ transmits a portion 192 of the light 111$b$, bypassing filter 190. The light from coupler $C_2$ is transmitted to a first detector 175.

Filter 190 receives the laser light 111$b$ and outputs a filtered light 191 having an amplitude that varies with the wavelength of the laser light 111$b$. The filtered light 191 is transmitted to a second detector 195. The filter 190 has a gain that is a function of the wavelength of the laser light 111$b$. The filter 190 may be, for example, a conventional etalon, notch filter, edge of crossing filter, band pass filter, low pass filter, high pass filter, or the like.

The filtered light 191 is used to provide feedback that is used to stabilize the frequency of the laser light 111$b$. More specifically, because the amplitude of the filtered light 191 is a function of the amplitude and wavelength of the laser light 111$b$, the ratio of the amplitude of the filtered light 191 to the amplitude of the laser light 192 depends on the wavelength. By monitoring the ratio, the wavelength may generally be determined. For some types of filters, a given ratio can only correspond to a single wavelength within the working range of the laser. For other types of filters (e.g., an etalon) several wavelengths may result in the same ratio; other known data may be used to determine which of these wavelengths produced that ratio.

For example, if an etalon is used, and the temperature of the laser is monitored, the wavelength may be approximated based on the temperature, and the actual wavelength is the wavelength which: (1) produces the observed ratio, and (2) lies nearest to the approximated wavelength.

By detecting the filtered light 191 and the light 192 that bypasses the filter 190, the wavelength of the light 111$b$ may be determined at any given time. However, the use of two separate detectors 175 and 195 may introduce a new problem, if the electronics that process the output signals from detector 175 age differently from, or drift from, the electronics that process the output signals of detector 195. In that case, it is not possible to determine whether a measured change in the ratio of signals 176 and 196 is due to an actual change in the laser wavelength, a change in the electronics conditioning the signals 176 from detector 175, a change in the electronics conditioning the signals 196 from detector 195, or any combination of these three causes.

According to the present invention, a single set of electronics in a single electrical conditioning circuit 140 is used to condition the signals from both the first detector 175 and the second detector 195. The conditioned signals are transmitted via the single circuit path to a processor 160. Any change in the electronics 140 is reflected in both the measurements of the filtered light 191 and the light 192 that bypasses the filter 190. These data may then be analyzed to isolate the wavelength of the laser 110.

As used herein, the term, "conditioning" refers to the process of transforming the raw electrical output signals 176 and 196 from the detectors 175 and 195 to a form that is usable by the processor 160. The conditioning circuitry 140 may include, for example, a pre-amplifier 142, a post-amplifier 144, a filter (not shown) and/or an analog to digital converter 150. One of ordinary skill recognizes that the specific configuration of conditioning circuitry 140 depends on the form of the output signals 176 and 196 of the detectors 175 and 195, and the nature of the processor 160.

Referring again to FIG. 1, the complete calibration system is described in greater detail below. Laser light 111b has an amplitude and a wavelength that varies as a function of the temperature of the laser 110.

The laser 110 may be a of a conventional type, such as a distributed feedback (DFB) laser, or a distributed Brag reflector (DBR) laser, or the like. The wavelength of the laser light 111b generated by these laser types is a function of the temperature of the laser 110. (The wavelength of a DBR laser is a function of both the temperature and a bias signal that is provided to the Brag reflector section of the DBR laser.) Thus, temperature adjustments may be used to adjust the wavelength of either a DFB or DBR laser.

In the exemplary embodiments, a temperature control device (which may be, for example, a thermoelectric cooler (TEC) 120), is thermally coupled to the laser 110 to control the temperature of the laser. The TEC 120 may be adjacent to the laser or may be mounted outside of the housing of the laser. Because the entire package may be quite small, it is possible to have a high thermal conductance between the laser 110 and the TEC 120, even if the TEC 120 is not abutting the laser 110. The TEC allows heating and cooling of the laser 110. Alternative heating devices may include a resistance heater (not shown).

Detector 175 may be, for example, a conventional P-I-N (positive-intrinsic-negative) diode, which may be, for example, an InGaAs, InP, or InAs type diode. Other suitable photodetectors may be used, including, but not limited to avalanche photodiode (APD), photon detectors, and thermal detectors.

A second detector 195, which may also be a P-I-N diode, provides a second signal 196 representing the amplitude of the filtered light 191. As described above, during normal operation of the laser 110, the ratio of amplitude of the filtered light 191 to the amplitude of the laser light 111b is determined based on the output signals 176 and 196 of the two diodes 175 and 195, respectively.

Processor 160 may be a microprocessor or microcontroller, an application specific integrated circuit (ASIC) or may be the processor of a general purpose computer. Processor 160 feeds back a control signal 119 to the TEC 120, and in the case of a DBR laser, may also adjust the bias signal 109 provided to the laser, based on the signals 176 and 196. A pair of digital-to-analog (D/A) convertors 108 and 118 convert the digital output signals of processor 160 into the analog input signals 109 and 119, which control TEC 210 and laser 110 respectively.

A switching device, which may be a three-way switch 165 is capable of providing either the first electrical signal 176, the second electrical signal 196, or current from a stable current source 180 (described below) as an output signal.

A common amplifier, which may include a pre-amplifier 142 and an optional post-amplifier 144, is coupled to the switching device 165 if more gain is needed. The common amplifier amplifies the output signal 166 of the switching device 165, to alternately provide a first amplified signal and a second amplified signal, representing the first and second electrical signals, respectively to the processor 160.

Processor 160 receives the first and second amplified signals and generates a control signal 109 and/or 119 that depends on the wavelength of the light 111b and is independent of the amplitude of the light 111b. The control signal 109 and/or 119 is used to control the light source 110, which is a laser in the example.

More specifically, if the TEC 120 is used to control the wavelength by adjusting the temperature of the laser 110, the processor 160 transmits a feedback signal 119 to control the TEC 120. If the laser is a DBR laser, the processor 160 transmits a bias signal 109 to a Bragg reflector section of the DBR laser based on the control signal. Alternatively, the processor may transmit both the feedback signal 119 to TEC 120 and the bias signal 109 to laser 110. Other laser types may require different or additional control signals. These different or additional control signals may be generated by the processor 160 and may be provided directly to the laser 110 (in the same way bias signal 109 is provided to laser 110.

Alternatively, the different or additional signals may be provided to a separate control device (in the same way that the TEC control signal 119 is provided to TEC 120).

A stable current source 180 may also be switched into the single electrical path. The current is set to approximate the current level that is transmitted by the detectors 175 and 195 during normal operation. The stable current source 180 may be used to calibrate the system 100 at any time both at a known current and zero current. Because the current source characteristics are known or can be monitored by processor 160, the transfer function of the conditioning circuitry 140 is readily determined. The following definitions are used in the equations below:

$i_s$=the multiplexed current
$R_F$=the transimpedance Feedback Impedance
$G_{PA}$=voltage gain of the post amplifier
$\Delta G_{PA}$=change in voltage gain of the post amplifier
$G_{AD}$=voltage gain of the A/D converter
$\Delta G_{AD}$=change in voltage gain of the A/D converter
$V_m$=voltage at the microcontroller
$V_{os}$=total voltage offset at $V_m$ At time t1 the voltage $V_m$ converted by the A/D converter is labeled $V_{mt1}$ and is given by:

$V_{mt1} = i_s R_F G_{PA} G_{AD}$

Assume that $V_{os} \cong 0$ at time $t_1$

The voltage $V_m$ at a time t2 (t2 is later than t1) is labeled $V_{mt2}$, and is given by:

$V_{mt2} \cong i_s R_F G_{PA} G_{AD} + i_s R_F \Delta G_{PA} G_{AD} + i_s R_F G_{PA} \Delta G_{AD} + \Delta V_{os}$ therefore at t2

$$V_{mt2} \cong \left(i_s R_F G_{PA} + \frac{\Delta V_{os}}{G_{AD}}\right) + i_s R_F G_{PA} G_{AD} \left[\frac{\Delta G_{PA}}{G_{PA}} + \frac{\Delta G_{AD}}{G_{AD}}\right] \quad (1)$$

$$V_{mt2} \cong i_s R_F G_{PA} \left(1 + \left(\frac{\Delta G_{PA}}{G_{PA}} + \frac{\Delta G_{AD}}{G_{AD}}\right)\right) G_{AD} + \Delta V_{os}$$

$$V_{mt2} - V_{mt1} = i_s R_F G_{PA} \left(\frac{\Delta G_{PA}}{G_{PA}} + \frac{\Delta G_{AD}}{G_{AD}}\right) G_{AD} + \Delta V_{os}$$

I.) First, set $i_s$=0; the change in offset $\Delta V_{os}$ is then determined from equation (2):

$$\Delta V_{os} = V_{mt2} - V_{mt1} \quad (2)$$

II.) Next, set $i_s \neq 0$ after the offset has been determined.
Define the voltage drift without offset, $V'_{mt2}$, as follows:

$V'_{mt2} = V_{mt2} - \Delta V_{os}$

The total drift without offset is then given by:

$$\frac{V'}{V_{mt1}}mt2 - 1 = \frac{\Delta G_{PA}}{G_{PA}} + \frac{\Delta G_{AD}}{G_{AD}} \quad (3)$$

The overall circuit gain error can be calculated by applying two currents (designated $i_{s1}$ and $i_{s2}$) at respectively different times.

$$V_{ml2} - V_{ml1} = i_{s2}R_F G_{PA} G_{AD} + i_{s2}R_F \Delta G_{PA} G_{AD} + i_{s2}R_F G_{PA} \Delta G_{AD} + \Delta V_{os} - i_{s1}R_F G_{PA} G_{AD}$$

Reducing, $$G_{AD}G_{PA}R_F = \frac{V_{ml2} - V_{ml1}}{\left[i_{s2}\left(1 + \frac{\Delta G_{PA}}{G_{PA}} + \frac{\Delta G_{AD}}{G_{AD}}\right) - i_{s1}\right] + \Delta V_{os}}$$

Substituting (2) and (3)

$$G_{AD}G_{PA}R_F = \frac{V_{ml2} - V_{ml1}}{i_{s2} - i_{s1} + V_{mt2} - V_{mt1}}$$

For a small time interval $V_{mt2} \cong V_{mt1}$; therefore the circuit gain error is $$G_{AD}G_{PA}R_F \simeq \frac{V_{ml2} - V_{ml1}}{i_{s2} - i_{s1}} \quad (4)$$

The drift in the electronics is known and may be corrected in the microprocessor.

$$\left|\frac{dc}{d\lambda}\right| \geq \left|\frac{C_{chi}}{\lambda \frac{\Delta f_s}{f}}\right| \left|\frac{\Delta C}{C_{chi}}\right|$$

$\Delta C$ is the optical path loss.
$\lambda$ is the wavelength or optical frequency at channel i.
$C_{chi}$ is the filter insertion loss for channel i.
$dc/d\lambda$ is the filter slope or selectivity.
f is the optical frequency.
$\Delta f_s/f$ is the normalized (in parts per million) target frequency deviation required for channel i.

Because the drift of the electronics is corrected in the software of processor 160, $\Delta C$ only includes the optical aging and drift effects from all causes at wavelength $\lambda$.

Figure 2:
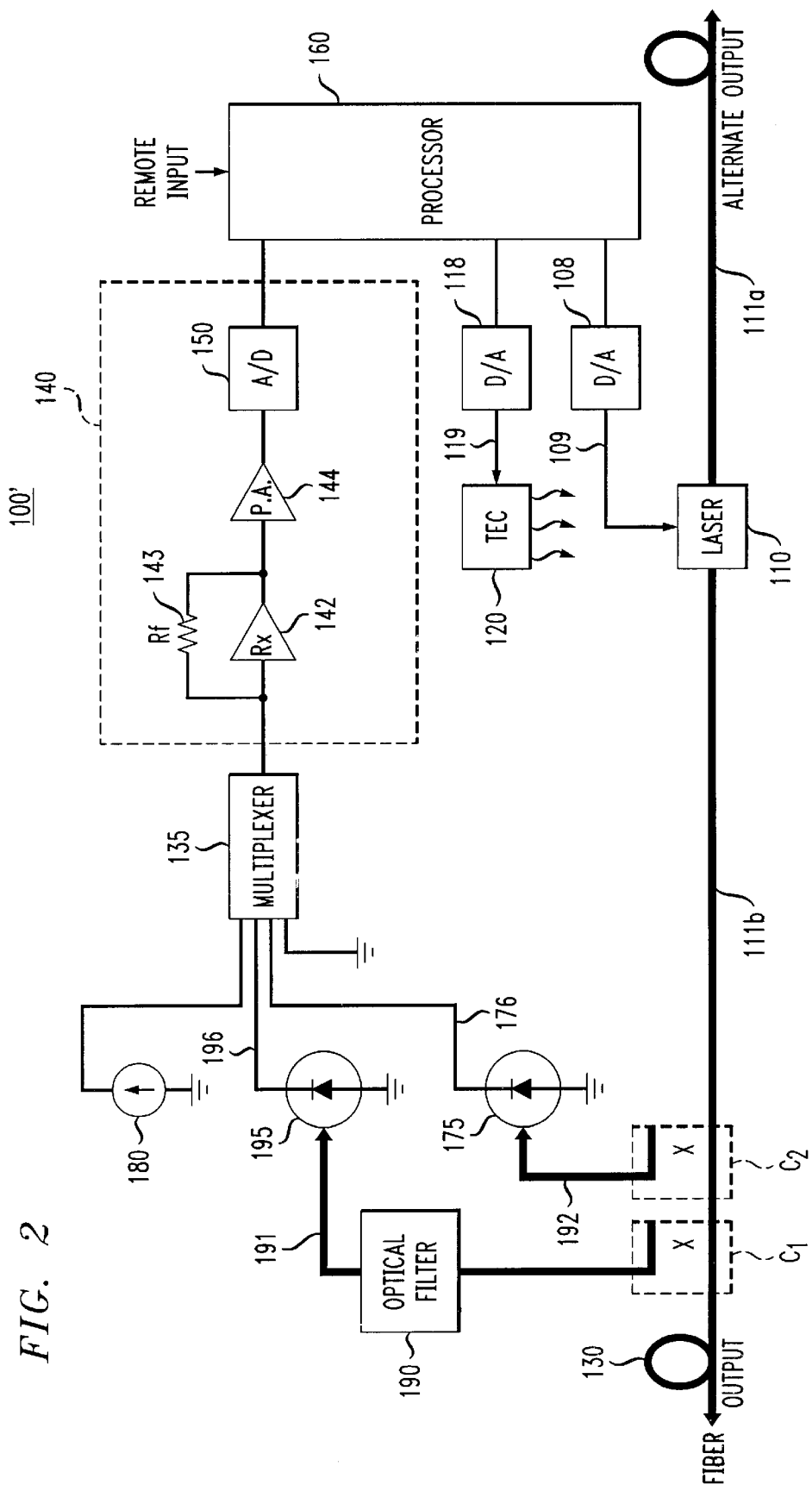
FIG. 2 is a block diagram of a second exemplary embodiment of the invention.

FIG. 2 shows a second exemplary system 100' according to the invention. Elements in FIG. 2 which are the same as the corresponding elements shown in FIG. 1 are designated by the same reference numerals, and a description thereof is not repeated herein.

In system 100', the switching device is a multiplexer 135. The multiplexer 135 has input terminals coupled to the first detector 175, the second detector 195, the stable current source 180, and ground. The ground connection may be used to zero the electronic path to eliminate drift or aging in the output offset level associated with the zero input condition.

One of ordinary skill recognizes that the processor may form the control signals 109 and 119 based on a variety of conventional algorithms, including proportional-integral-derivative control and fuzzy control.

Although the exemplary light source is a laser 110, the invention may be applied to stabilization of other optical source types such as LEDs, other laser types such as FP, DFB or DBR lasers. These methods may be applied to other photodetector types such as APDs or phototransistors and other optical filter types such as Mach-Zehnder devices. One of ordinary skill can readily configure control circuitry for any of these other types of light sources to avoid the effects of aging or drift of the electronics by multiplexing the signal from two different optical detectors through the same electrical path.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. In a system for controlling a light source, the system having first and second optical detectors providing first and second electrical signals, respectively, an improved method for conditioning the first and second electrical signals to form conditioned signals that are used by a processor to control the light source, the method comprising the steps of:
   alternately providing the first and the second electrical signals into a single electrical path that is connected to the processor, wherein the first electrical signal varies with an amplitude of a light that is output by the light source, and the second electrical signal varies with the amplitude and wavelength of the light;
   conditioning the first and second signals in the single electrical path; and
   determining the wavelength of the light source based on the ratio of the conditioned second electrical signal to the conditioned first electrical signal.

2. The method of claim 1, wherein the step of conditioning includes amplifying the first and second electrical signals and converting the amplified signals from an analog format to a digital format.

3. The method of claim 1, wherein the step of multiplexing further includes multiplexing a stable current source into the single electrical path, and the method further comprises calibrating the system using current from the current source.

4. A method for controlling a light source, comprising the steps of:
   (a) providing a first electrical signal representing an amplitude of a first light that is output by the light source;
   (b) filtering the first light to provide a filtered light having an amplitude that depends on the amplitude of the first light and a wavelength of the first light;
   (c) providing a second electrical signal representing the amplitude of the filtered light;
   (d) alternately providing the first and second electrical signals to a common amplifier;
   (e) amplifing the first and second electrical signals in the common amplifier, to form a first amplified signal and a second amplified signal, respectively; and
   (f) controlling the light source based on the first and second amplified signals.

5. The method of claim 4, wherein the light source is a laser.

6. The method of claim 5, wherein step (f) includes:
   (f1) processing the first and second amplified signals to form a control signal that depends on the wavelength of the laser light and is independent of the amplitude of the laser light; and
   (f2) controlling the laser based on the control signal.

7. The method of claim 5, wherein step (b) includes using a filter having a gain that is a function of the wavelength of the laser light.

8. The method of claim 5, wherein step (b) includes using an etalon as the filter.

9. The method of claim 5, wherein step (d) includes operating a switch to alternately provide the first electrical signal or the second electrical signal to the common amplifier.

10. The method of claim 5, wherein step (d) includes using a multiplexer to alternately provide the first electrical signal or the second electrical signal to the common amplifier.

11. The method of claim 5, further comprising:
providing a common stable current from a stable current source for calibrating the apparatus.

12. The method of claim 5, wherein step (f) includes adjusting one of the group consisting of the temperature of the laser and a bias signal that is input to the laser, the adjusting being based on the control signal.

13. The method of claim 12, wherein step (f) includes adjusting the bias signal to a Brag reflector section of a distributed Bragg reflector laser based on the control signal.

14. Apparatus for detecting light from a light source, comprising a first detector that provides a first electrical signal representing an amplitude of an first light that is output by the light source;
a filter that receives the first light and provides a filtered light having an amplitude that depends on the amplitude and a wavelength of the first light;
a second detector that provides a second electrical signal representing the amplitude of the filtered light;
a switching device capable of providing either the first electrical signal or the second electrical signal as an output signal thereof; and
a common amplifier coupled to the switching device, the common amplifier amplifying the output signal of the switching device, to alternately provide a first amplified signal and a second amplified signal, representing the first and second electrical signals, respectively.

15. The apparatus of claim 14, further comprising:
a processor that receives the first and second amplified signals and generates a control signal that depends on the wavelength of the first light and is independent of the amplitude of the first light, the control signal being used to control the light source.

16. Apparatus according to claim 15, further comprising an analog-to-digital converter that receives the first and second amplified signals, converts the first and second amplified signals to digital form, and provides the converted first and second amplified signals to the processor.

17. Apparatus according to claim 15, wherein the processor is a microprocessor, a microcontroller or ASIC or general purpose computer.

18. Apparatus according to claim 15, further comprising a thermoelectric cooler that controls the temperature of the laser based on the control signal, thereby to adjust the wavelength of the laser.

19. Apparatus according to claim 15, the laser is a distributed Bragg reflector (DBR) laser and the processor transmits a bias signal to a Bragg reflector section of the DBR laser based on the control signal.

20. Apparatus according to claim 14, wherein the light source is a laser.

21. Apparatus according to claim 14, wherein each of the first and second detectors is selected from the group consisting of P-I-N diodes, avalanche photodiode (APD), photon detectors, and thermal detectors.

22. Apparatus according to claim 14, wherein the filter has a gain that is a function of the wavelength of the laser light.

23. Apparatus according to claim 14, wherein the filter is an etalon.

24. Apparatus according to claim 23, further comprising a stable current source, wherein the multiplexer has input terminals coupled to the first detector, the second detector, the stable current source, and ground.

25. Apparatus according to claim 14, wherein the switching device is a multiplexer.

26. Apparatus according to claim 14, wherein the amplifier includes a pre-amplifier.

27. In a system for controlling a light source, the system having first and second optical detectors providing first and second electrical signals, respectively, an improved apparatus for conditioning the first and second electrical signals to form conditioned signals that are used by a processor to control the light source, the apparatus comprising:
a multiplexer for receiving the first electrical signal, which varies with an amplitude of a light that is output by the light source, and the second electrical signal, which varies with the amplitude and wavelength of the light, the multiplexer alternately providing the first and second electrical signals to a single circuit path;
a conditioning circuit, within the single circuit path, that conditions the first and second electrical signals into a form usable by the processor, the conditioning circuit including an amplifier and an analog to digital converter,
wherein the processor determines the wavelength of the light source based on the ratio of the conditioned second electrical signal to the conditioned first electrical signal.

28. Apparatus according to claim 27, wherein:
the first electrical signal is generated by the first detector based on a first light,
the first light is filtered to form a second light, and
the second electrical signal is generated by the second detector based on the second light.

29. Apparatus according to claim 27, wherein the light source is a laser.

30. Apparatus according to claim 27, wherein:
the amplifier includes a pre-amplifier.

31. Apparatus according to claim 27, wherein:
the multiplexer has input terminals coupled to the first optical detector, the second optical detector, a stable current source, and ground.

32. Apparatus according to claim 27, wherein the processor is a microprocessor, a microcontroller, an ASIC, or a general purpose computer.

33. Apparatus according to claim 27, wherein the light source is a laser, and either:
the system includes a thermoelectric cooler that controls the temperature of the laser, and the processor transmits on a feedback signal to control the thermoelectric cooler; or
the laser is a distributed Bragg reflector (DBR) laser, and the processor transmits a bias signal to a Bragg reflector section of the DBR laser based on the control signal.

34. Apparatus according to claim 27, wherein:
the first and second optical detectors are selected from the group consisting of P-I-N diodes, avalanche photodiode (APD), photon detectors, and thermal detectors.

* * * * *